(12) United States Patent
Woo et al.

(10) Patent No.: US 6,944,436 B2
(45) Date of Patent: Sep. 13, 2005

(54) DIRECT CONVERSION TRANSCEIVER CAPABLE OF REDUCING DC OFFSET USING MULTICHIP MODULE

(75) Inventors: Sang-hyun Woo, Seoul (KR); Sang-min Nam, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 430 days.

(21) Appl. No.: 10/216,899

(22) Filed: Aug. 13, 2002

(65) Prior Publication Data

US 2003/0032401 A1 Feb. 13, 2003

(30) Foreign Application Priority Data

Aug. 13, 2001 (KR) ......................................... 2001-48739

(51) Int. Cl.[7] .............................. H04B 1/10; H04B 1/04; H04B 15/06
(52) U.S. Cl. ...................... 455/317; 455/300; 455/117; 455/114.1; 455/114.2; 455/63.1
(58) Field of Search ........................ 455/317, 318–321, 455/327, 328, 296, 300, 301, 292, 217, 106, 114.1, 114.2, 117, 118, 347, 349, 63.1

(56) References Cited

U.S. PATENT DOCUMENTS

| | | | | |
|---|---|---|---|---|
| 5,170,500 A | * | 12/1992 | Broderick | 455/315 |
| 5,303,417 A | * | 4/1994 | Laws | 455/314 |
| 5,467,055 A | * | 11/1995 | Wray et al. | 330/129 |
| 5,949,830 A | | 9/1999 | Nakanishi | |
| 6,049,702 A | * | 4/2000 | Tham et al. | 455/78 |
| 6,144,243 A | * | 11/2000 | Vaisanen | 327/307 |
| 6,233,444 B1 | * | 5/2001 | Nakanishi | 455/313 |

FOREIGN PATENT DOCUMENTS

| | | | |
|---|---|---|---|
| JP | A-61-264923 | 11/1986 | |
| JP | 3220823 | 9/1991 | |
| JP | 405110336 A | * 4/1993 | ............ H03B/5/02 |
| WO | WO 00/36757 | 6/2000 | |

OTHER PUBLICATIONS

Nakatsugawa M., et al., *Line–Loss and Size Reduction Techniques for Millimeter–Wave RF Front–End Boards by Using a Polyimide/Alumina–Ceramic Multilayer Configuration*, IEEE Transactions on Microwave Theory and Techniques, vol. 45, No. 12, Dec. 1997, pp. 2308–2315.

* cited by examiner

Primary Examiner—Duc M. Nguyen
(74) Attorney, Agent, or Firm—Buchanan Ingersoll PC

(57) ABSTRACT

A direct conversion transceiver capable of reducing a DC offset, using a multi-chip module is provided. In the transceiver, a mixer and an element constituting a local oscillator are positioned above a shielding ground surface, and an interconnection connecting the mixer and the element constituting the local oscillator are positioned below the shielding ground surface. The transceiver is formed as a multi-chip module and thus its size is not bigger than a one-chip direct conversion receiver and advantageous in that its size and manufacturing costs are less than a general direct conversion receiver that additionally includes a DC offset cancellation circuit or an off-chip type oscillator for reducing a DC offset.

22 Claims, 5 Drawing Sheets

DIRECT CONVERSION TRANSCEIVER CAPABLE OF REDUCING DC OFFSET USING MULTICHIP MODULE

Priority is claimed to Patent Application Number 2001-48739 filed in Republic of Korea on Aug. 13, 2001, herein incorporated by reference.

BACKGROUND OF THE INVENTION

1. Field of the Invention

The present invention relates to a direct conversion transceiver, and more particularly, to a direct conversion transceiver that is capable of reducing a DC offset using a multi-chip module.

2. Description of the Related Art

Wireless mobile phones have been developed to reduce their sizes, power consumption and manufacturing costs. Nonetheless, these factors are still important factors that must be improved to manufacture good-quality wireless mobile phones.

To improve the above factors, it is effective to apply direct conversion architecture to a radio-frequency (RF) part, thereby removing an image rejection filter and also, reducing the number of elements required.

However, the use of the direct conversion architecture causes a DC offset that is confused with an actual signal and saturates an amplifier installed next to a mixer.

Accordingly, various methods or apparatuses for reducing the DC offset have been developed. FIGS. 1 and 2 are circuit diagrams of general direct conversion receivers for reducing the DC offset.

Referring to FIG. 1, a signal received by an antenna 10 is amplified by a first amplifier 12 and then is combined with a reference signal output from a local oscillator 34 by the first and second mixers 14 and 16. During this process, carrier signals are excluded from signals output from the first and second mixers 14 and 16. These signals pass through first and second low-pass filters (LPFs) 18 and 20, respectively, and as a result, high-frequency components contained in these signals are canceled. Signals output from the first and second LPFs are amplified by second and third amplifiers 26 and 30, respectively. Here, reference numeral 36 denotes a phase shifter that shifts the phase of the reference signal output from the local oscillator 34 by 90°.

Thereafter, as shown in FIG. 3, when a reference signal cos $W_{LO}t$ is injected to the first mixer 14 from a local oscillator (not shown), an oscillator signal leakage 50 may be caused during substrate coupling and bond wire coupling. Further, as shown in FIG. 4, large interfere leakage 52 is also generated when an interference signal, which is received via the antenna 10, is amplified by the first amplifier 12 by the substrate coupling and bond wire coupling. The oscillator signal leakage 50 and the large interfere leakage 52 are self-mixed to generate the DC offset.

For reduction of the DC offset, the conventional direct conversion receiver of FIG. 1 includes a first capacitor 22 between the first LPF 18 and the second amplifier 26, and a second capacitor 24 between the second LPF 20 and the third amplifier 30. The first and second capacitors 22 and 24 are massive and additionally require grounding circuits 28 or 32 to be charged or discharged, respectively, thereby increasing the size of the circuit. Also, the first and second capacitors 22 and 24 are useful only for frequency shift keying modulation.

FIG. 2 shows a method for removing a DC offset through which the DC offset received to first and second analog-to-digital (A/D) converters 40 and 42 is operated by a data processing circuit 44 and a DC offset operated by a negative feedback loop including first and second digital-to-analog (D/A) converters 46 and 48 is subtracted. The first D/A converter 46 is positioned between a first mixer 14 and the data processing circuit 44, and converts a predetermined digital signal, which is output from the data processing circuit 44, into an analog signal and feeds the analog signal back to the first mixer 14. The second D/A converter 48 is positioned between a second mixer 16 and the data processing circuit 44, and converts a predetermined digital signal into an analog signal and feeds the analog signal back to the second mixer 16. (For details of the circuit of FIG. 2, see Japanese Patent Publication Laid-Open No. Hei 3-220823 entitled "Direct Convergence Receiver")

However, the circuit of FIG. 2 is disadvantageous in that it uses a closed loop, and thus loop convergence time is limited. For this reason, this circuit is not available to wireless mobile phones having short time slots.

SUMMARY OF THE INVENTION

To solve the above problem, it is an object of the present invention to provide a direct conversion receiver that is compact, economical and inexpensive, and can be applied to various wireless mobile phones.

To achieve one aspect of the above object, there is provided a direct conversion receiver including a first amplifier for amplifying a signal input from an antenna; a mixer for separating a carrier signal from the signal output from the first amplifier using a predetermined reference signal; a local oscillator for supplying the predetermined reference signal to the mixer; a low-pass filter (LPF) for excluding a high-frequency component from the signal output from the mixer; a second amplifier for amplifying the signal output from the LPF; and a shielding ground surface for preventing mixing of signals leaking during which the signal is received by the antenna and processed, wherein the mixer and an element constituting the local oscillator are positioned above the shielding ground surface, and an interconnection connecting the mixer and the element constituting the local oscillator are positioned below the shielding ground surface.

A via hole is formed to pass through the shielding ground surface and expose one end of the interconnection, and the mixer is connected to the interconnection via a conductive plug filling the via hole.

A via hole is formed to pass through the shielding ground surface and expose the other end of the interconnection, and the element of the local oscillator is connected to the interconnection via a conductive plug filling the via hole that exposes the other end of the interconnection.

Two via hole is interconnected by metal line under the shielding ground surface.

Passive elements of the local oscillator, which is also used as passive elements of the mixer, the first amplifier, the second amplifier and the LPF, are formed below the shielding ground surface.

The thickness of the shielding ground surface is several times as thick as the skin depth of the signal leakage.

The mixer, the first and second amplifiers, and the LPF may be installed in one bare chip. Otherwise, the mixer may be installed in one bare chip, and the first and second amplifiers and the LPF may be installed in another bare chip.

The mixer, Local oscillator and other components are bonded with the interconnection by Flip-chip bonding, wire bonding or die attach.

The first amplifier is a low-noise amplifier (LNA) or a drive amplifier (DA), and the second amplifier is a drive amplifier.

To achieve another aspect of the above object, there is provided a direct conversion transmitter including a first amplifier for amplifying a signal to be transmitted; an LPF for excluding a high-frequency component from the signal output from the first amplifier; a mixer for mixing the signal output from the LPF and a given reference signal; a local oscillator for supplying the reference signal to the mixer; a second amplifier for amplifying the signal output from the mixer before this signal is transmitted to the outside via an antenna; and a shielding ground surface for preventing mixing of signals leaking when the signal is transmitted, wherein the mixer and an element of the local oscillator are positioned above the shielding ground surface, and an interconnection, which connects the mixer to the element of the local oscillator, is positioned below the shielding ground surface.

The mixer, Local oscillator and other components are bonded with the interconnection by Flip-chip bonding, wire bonding or die attach.

A via hole is formed to pass through the shielding ground surface and expose one end of the interconnection, and the mixer is connected to the interconnection via a conductive plug filling the via hole.

A via hole is formed to pass through the shielding ground surface and expose the other end of the interconnection, and the elements of the local oscillator are connected to the interconnection via a conductive plug filling the via hole that exposes the other end of the interconnection. The element of the local oscillator is an active element of the local oscillator, which is formed as a bare chip. Passive elements of the local oscillator, which are used as passive elements of the mixer, the first amplifier, the second amplifier, or the LPF, are formed below the shielding ground surface.

The thickness of the shielding ground surface is several times as thick as the skin depth of the signal leakage. The mixer, the first and second amplifiers, and the LPF may be installed in one bare chip. Otherwise, the mixer may be installed in one bare chip, and the first and second amplifiers and the LPF may be installed in another bare chip. The second amplifier is a power amplifier or a drive amplifier.

The present invention adopts a multi-chip module mode, and thus is more compact, economical and inexpensive than a direct conversion receiver including a circuit for reducing a DC offset or an off-chip oscillator.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
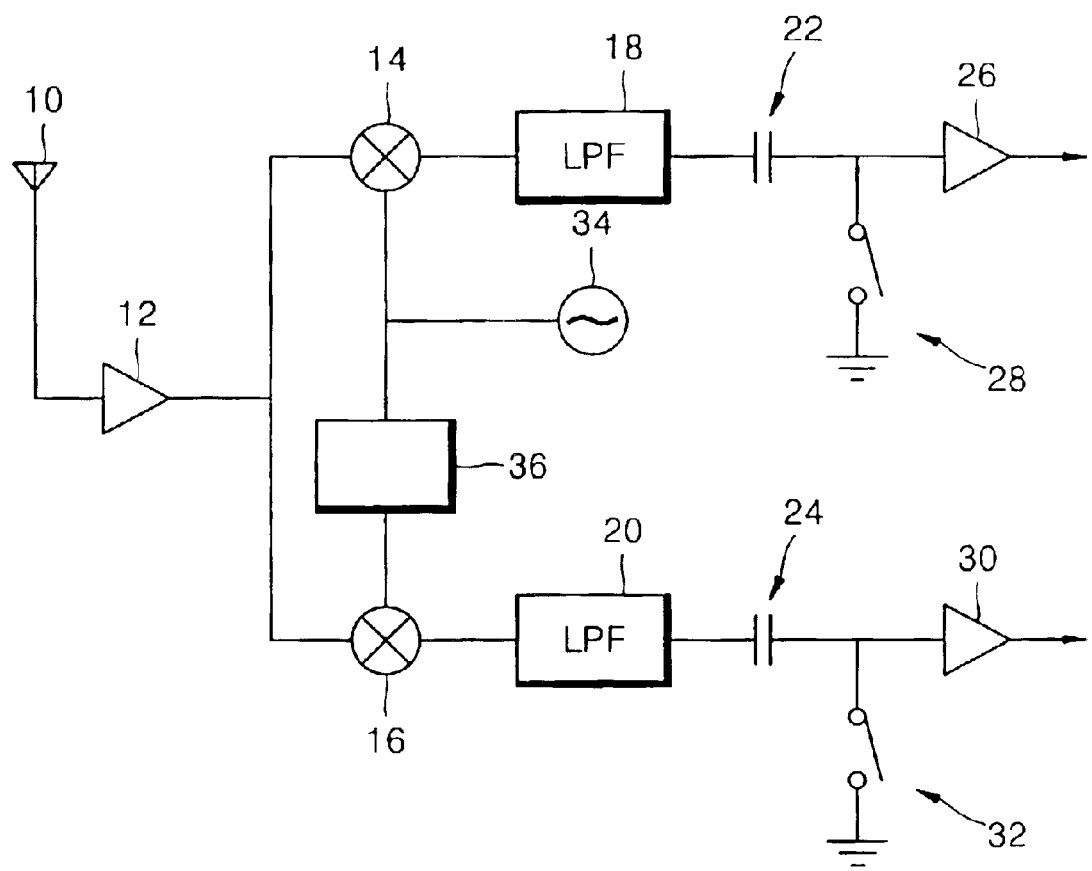
FIGS. 1 and 2 are circuit diagrams explaining general direct conversion receivers for reducing a DC offset.
Figure 2:
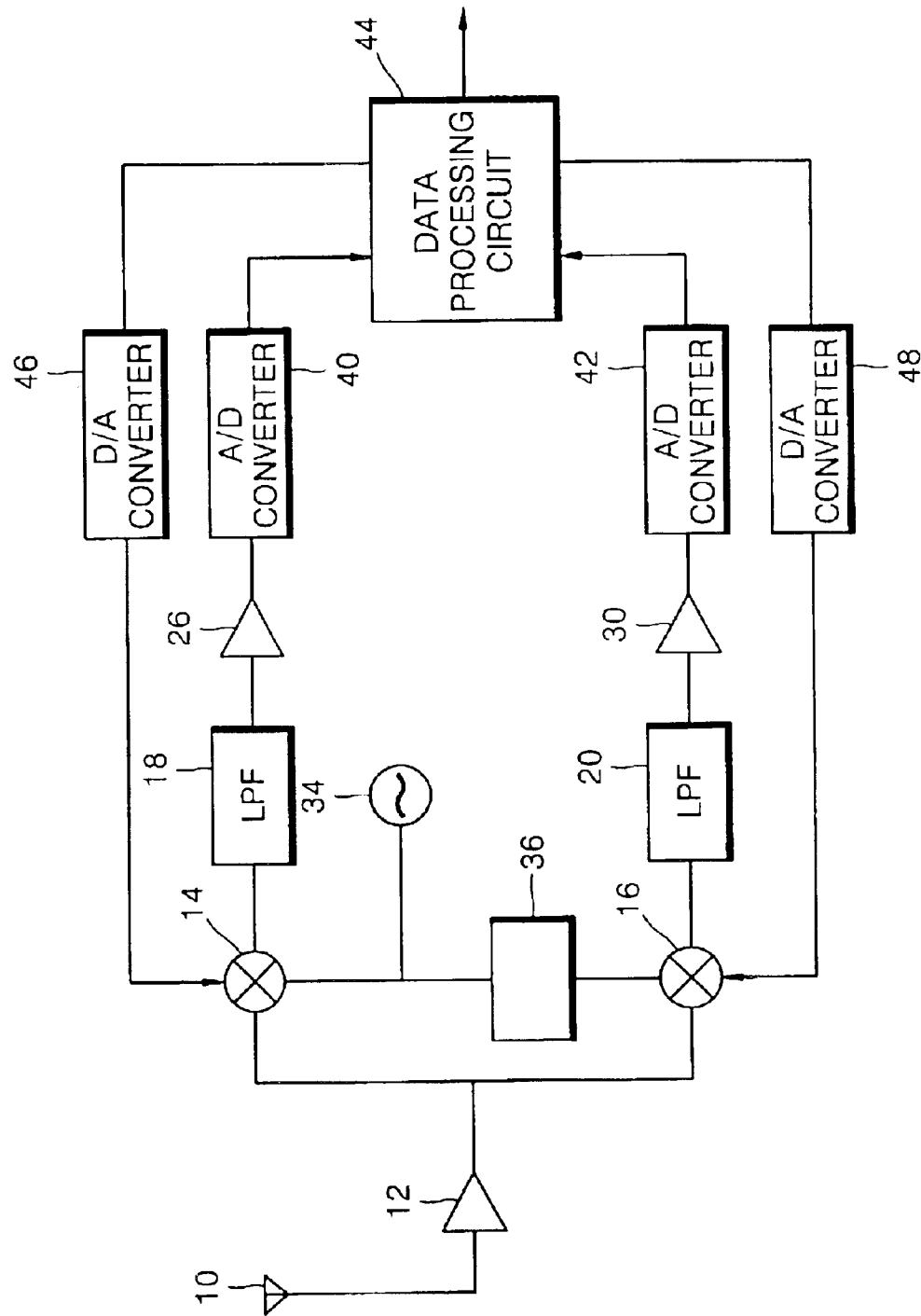
Figure 3:
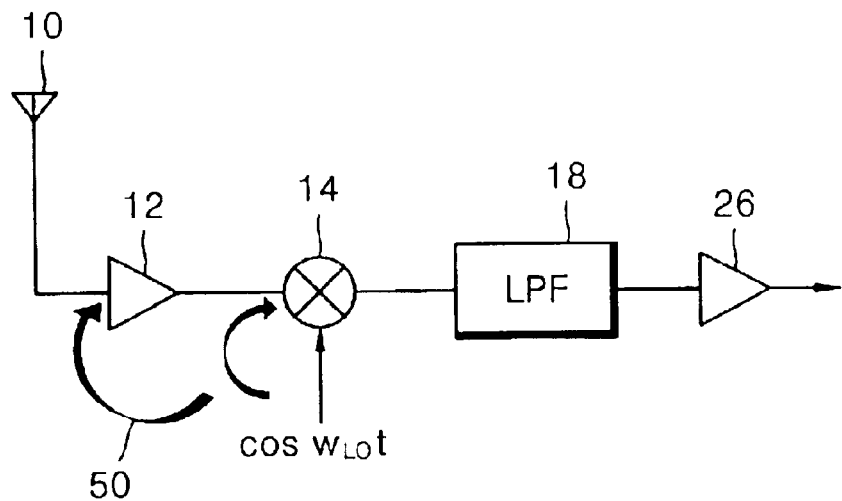
FIG. 3 is a circuit diagram explaining the occurrence of oscillator signal leakage in a general direct conversion receiver.
Figure 4:
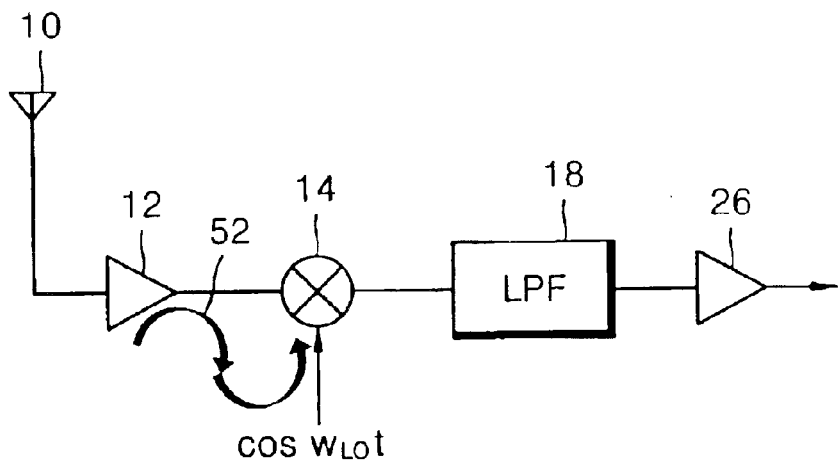
FIG. 4 is a circuit diagram explaining the occurrence of interfere leakage in a general direct conversion receiver.
Figure 5:
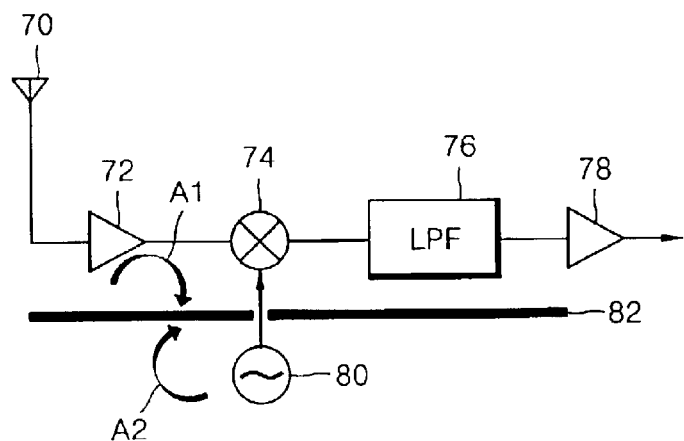
FIG. 5 is a circuit diagram of a direct conversion receiver, according to the present invention, that is capable of reducing a DC offset, using a multi-chip module.

Referring to FIG. 5, reference numerals 74 and 80 denote a mixer and a local oscillator, respectively. The mixer 74 mixes a signal, which is received by an antenna 70 and amplified by a first amplifier 72, and a predetermined reference signal and then rejects a carrier signal from the signal output from the first amplifier 72. The first amplifier 72 includes a low-noise amplifier or a drive amplifier. The local oscillator 80 provides the mixer 74 with the predetermined reference signal that is used to separate the carrier signal from the signal. A shielding ground surface 82 is formed between the mixer 74 and the local oscillator 80. A signal output from the local oscillator 80 is sent to the mixer 74 via a region limited by the shielding ground surface 82. The shielding ground surface 82 absorbs and shields signal leakage A2 and interfere leakage A1 that occur at the local oscillator 80 and the mixer 74, respectively, during the processing of the signal received by the antenna 70. For this operation, the thickness of the shielding ground surface 82 is several times, preferably more than three times, as thick as skin depth of these leakages. With the installation of the shielding ground surface 82 between the mixer 74 and the local oscillator 80, the signal leakage A2 and interfere leakage A1 are prevented from being mixed with itself thus minimizing the DC offset. In FIG. 5, reference numerals 76 and 78 denote a low-pass filter (LPF) that rejects a high-frequency component from a signal output from the mixer 74, and a second amplifier such as a drive amplifier that amplifies a signal output from the LPF 76, respectively.

Hereinafter, an embodiment of a direct conversion receiver, according to the present invention, for reducing the DC offset, using a multi-chip module will be described in a greater detail.

Figure 6:
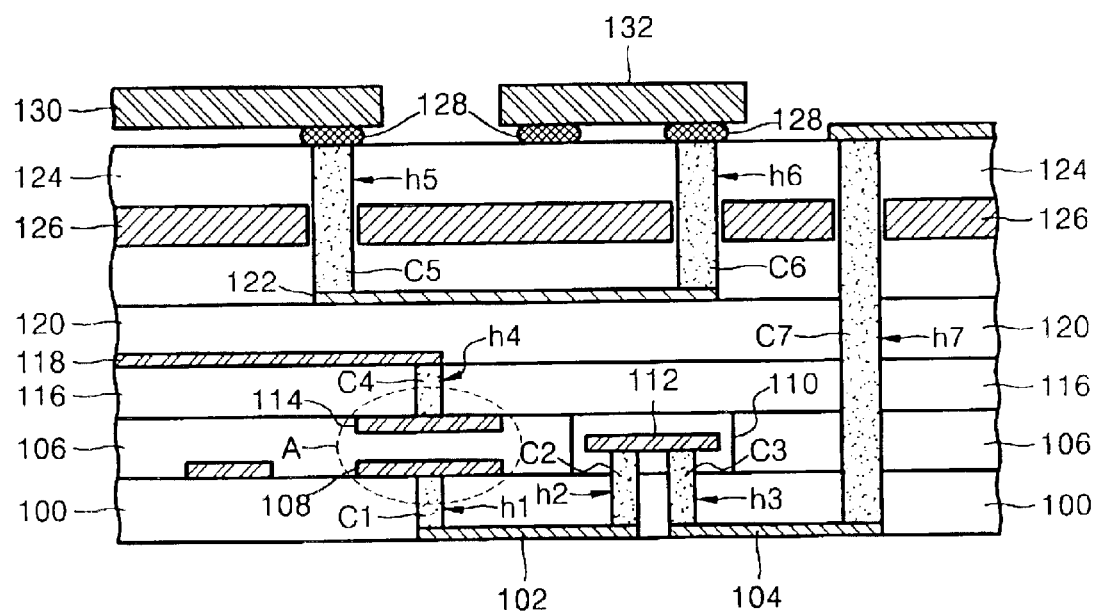
FIG. 6 is a partial cross-sectional view of a direct conversion receiver of FIG. 5 that is capable of reducing a DC offset, using a multi-chip module.

Referring to FIG. 6, a first interconnection 102 is formed at the bottom of a first substrate 100, and a second interconnection 104 is formed to be separated from the first interconnection 102 at a predetermined interval.

A first via hole h1 is formed to expose one end of the first interconnection 102 and filled with a first conductive plug C1. A first conductive layer 108 is formed to contact the entire first plug C1 on the first substrate 100. A second via hole h2 is also formed to expose the other end of the first interconnection 102 on the first substrate 100. The second via hole h2 is distant from the first via hole h2 by the length of the first interconnection 102. The second via hole h2 is filled with a second conductive plug C2 which contacts the exposed other end of the first interconnection 102. A portion of the second conductive plug C2 protrudes into a cavity 110 formed on a second substrate 106 on the first substrate 100. A third via hole h3 is formed to expose one end of the second interconnection 104 adjacent to the other end of the first interconnection 102 on the first substrate 100. The third via hole h3 is filed with a third conductive plug C3 which contacts one end of the second interconnection 104. The third conductive plug C3 also protrudes into the cavity 110 with the same height as the second conductive plug C2.

The second substrate 106 is formed on the first substrate 100 to cover the first conductive layer 108 and includes the cavity 110. In the predetermined region, an inductor 112 that is held by the second and third conductive plugs C2 and C3 is formed. The inductor 112 is connected to the first conductive layer 108 via the second conductive plug C2, the first interconnection 102 and the first conductive plug C1. Here, the inductor 112 is one of passive elements of a local oscillator (not shown). A conductive layer 114 is formed to face the first conductive layer 108 in the second substrate 106. The first and second conductive layers 108 and 114, and the second substrate 106, which is formed between the first and second conductive layers 108 and 114, form a capacitor A which is one of passive elements of the local oscillator. The inductor 112, the capacitor A may be used as passive elements of an element 130 including the mixer 74, first or second amplifier.

A third substrate 116 is formed on the second substrate 106 to cover the second conductive layer 114. Therefore, the predetermined portion excluded from the second substrate 106 becomes the cavity 110.

The third substrate 116 has a fourth via hole h4 to expose a portion of the second conductive layer 114, and the fourth via hole h4 is filled with a fourth conductive plug C4 that contacts the exposed portion of the second conductive layer 114. The third substrate 116 also has a third interconnection 119 that contacts the fourth conductive plug C4. A fourth interconnection 120 is formed on the third substrate 116 to cover the third interconnection 118. A fourth interconnection 122 is formed on a predetermined region of the fourth substrate 120. A fifth substrate 124 is formed on the fourth substrate 120 to cover the fourth interconnection 122. Both ends of the fourth interconnection 122 are exposed by fifth and sixth via holes h5 and h6 at the fifth substrate 124. The exposed ends are each in contact with fifth and sixth conductive plugs C5 and C6 that fill the fifth and sixth via holes h5 and h6, respectively. The fifth substrate 124 has a seventh via hole h7 that exposes the other end of the second interconnection 104 while passing through the first through fourth substrates 100, 106, 116 and 120. The seventh via hole h7 is filled with a seventh conductive plug C7 that contacts the other end of the second interconnection 104. A shielding ground surface 124 is present between the fifth through seventh via holes h5 to h7, above the fourth interconnection 122. The element 130 including the mixer, and a portion of the local oscillator, which is an active element 132, are positioned above the fifth substrate 124 in the form of bare chips. Preferably, the element 130 including the mixer and the portion of the oscillator are separately from each other at some distant so as to reduce interference therebetween. In contrast, preferably, the shielding ground surface 126 and the portion of the oscillator are adjacent to each other as much as possible so as to absorb signal leakage. The element 130 including the mixer, and the active element 132 are bonded with the conductive plugs C5 and C6 via a bonding material 128, respectively. Here, the bonding of the element 130 including the mixer, and the active element 132 may be performed by wire bonding, preferably flip-chip bonding. Otherwise, the element 130 including the mixer, and the active element 132 may be die-attached to the conductive plugs C5 and C6, respectively. Also, the element 130 may include an amplifier, such as a low-noise amplifier, a power amplifier and a drive amplifier, or a filer, as well as the mixer.

As previously mentioned, the element 130 including the mixer is connected to the fifth conductive plug C5, which contacts the one end of the fourth interconnection 122, and the active element 132 of the portion of the local oscillator is connected to the sixth conductive plug C6 which contacts the other end of the fourth interconnection 122. As a result, the element 130 and the active element 132 are connected to each other via the fourth interconnection 122.

Meanwhile, most signal leakage occurring in the element 130 and the active element 132 is caused by the fourth interconnection 122 but a greater part of the signal leakage is absorbed by the shielding ground surface 126 because the fourth interconnection 122 is formed below the shielding ground surface 126. Therefore, preferably, the thickness of the shielding ground surface 126 is several times, preferably at least more than three times, as thick as the skin depth of the signal leakage.

The signal leakage also occurs in the bonding material 128 that bonds the element 130 and the active element 132 with the fifth and sixth conductive plugs C5 and C6, respectively, and the fifth and sixth conductive plugs C5 and C6 through which a signal, which is output from the active element 132 to the element 130, passes. However, since the length of the signal generated from the bonding material 128 and conductive plugs C5 and C6 is very short, the shielding ground surface 126 can completely absorb and shied signal leakage occurring between the element 130 and the active element 132 in consideration of a fact that signal leakage is proportional to the length of an interconnection.

Therefore, most signal leakage occurring between the element 130 including the mixer and the active element 132 of the local oscillator is shielded by the shielding ground surface 126. A DC offset, which is formed by self-mixing can be minimized.

In fact, the lengths of the bonding material 128 and the fifth and sixth conductive plugs C5 and C6 are still shorter than that of the fourth interconnection 122. However, for clarity, their lengths are somewhat exaggerated.

Figure 7:
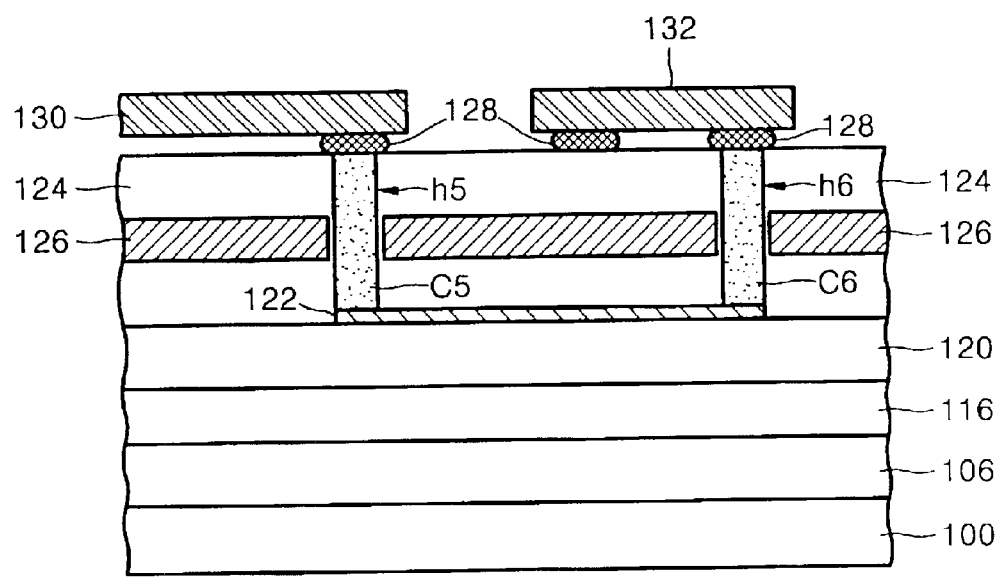
FIG. 7 is a view of another embodiment of a direct conversion receiver, according to the present invention, that is capable of reducing a DC offset, using a multi-chip module.

FIG. 7 is a view of another embodiment of a direct conversion receiver according to the present invention, in which the all of the Local oscillator components 132 may be formed as one chip, and passive elements such as the capacitor A, the inductor 112, and the first and second interconnections 102 and 104 can be omitted, unlike in FIG. 6.

Hitherto, a direct conversion receiver according to the present invention is described. Similarly, a direct conversion transmitter according to the present invention may include a shielding ground surface to prevent mixing of leaking signals.

Figure 8:
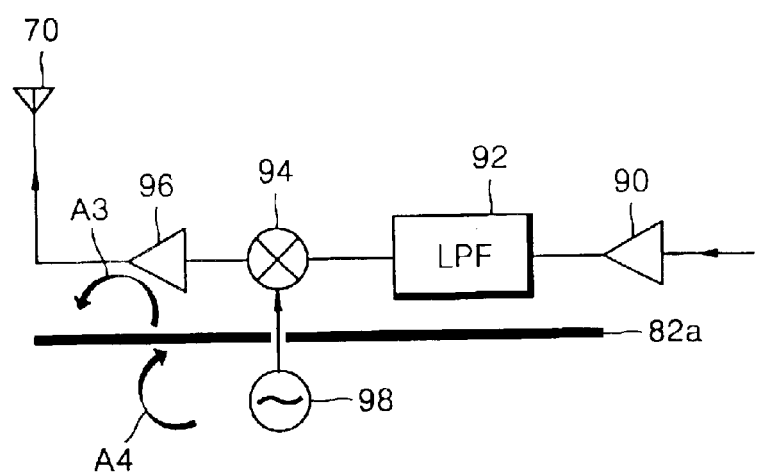
FIG. 8 is a circuit diagram of a direct conversion receiver, according to the present invention, that is capable of reducing a DC offset, using a multi-chip module.

FIG. 8 is a view of an embodiment of a direct conversion transmitter according to the present invention. Here, reference numerals 90 and 96 denote first and second amplifiers installed in a conversion transmitter, respectively. The first amplifier 90 amplifies a signal input to a low-pass filter (LPF) 92, and the second amplifier 96 amplifies a signal output from a mixer 94 before this signal is output to the outside via an antenna 70. Preferably, the first amplifier 90 is a drive amplifier, and the second amplifier 96 is a power amplifier (PA) or a drive amplifier (DA). The LPF 92 and the mixer 94 are sequentially formed between the first and second amplifiers 90 and 96. The LPF 92 excludes a high-frequency component from a signal transmitted from the first amplifier 90. The mixer 94 mixes the signal passing through the LPF 92 and a reference signal generated by a local oscillator 98 which is connected to the mixer 94 via a shielding ground surface 82a, and outputs the mixed signal to the second amplifier 96. The shielding ground surface 82a absorbs signal leakage A3 occurring at the local oscillator 98 and the mixer 94, respectively, when transmitting a signal. Preferably, the structure and operations of the shielding ground surface 82a are identical with as those of the shielding ground surface 82 of FIG. 5.

A cross section of the direct conversion transmitter shown in FIG. 8 is the same as the cross-sections of the direct conversion receivers in FIGS. 6 and 7. Therefore, a detailed description of the direct conversion transmitter of FIG. 8 will be omitted here.

While this invention has been particularly shown and described with reference to preferred embodiments thereof, it will be understood by those skilled in the art that various changes in form and details may be made therein without departing from the spirit and scope of the invention as defined by the appended claims. For instance, according to the present invention, each via hole is formed to expose one end or the other end of one of the first through fourth interconnections 102, 104, 118 and 112. However, each via hole may be formed to expose an inner portion of one of these interconnections 102, 104, 118 and 112. Also, the first and second interconnections 102 and 104 may be each coated with a protective material to be protected from outer shocks.

As described above, a direct conversion transceiver according to the present invention is formed as a multi-chip module and thus its size is not bigger than a one-chip direct conversion receiver. Further, an interconnection, which connects a mixer to an active element of an oscillator and at which most signal leakage occurs, is installed below a shielding ground surface, and the mixer and the active element of the oscillator are formed above the shielding ground surface, thereby reducing the occurrence of a DC offset. Owing to this structure, a direct conversion transceiver according to the present invention is advantageous in that its size and manufacturing costs are less than a general direct conversion receiver that additionally includes a DC offset cancellation circuit or an off-chip type oscillator for reducing an DC offset.

What is claimed is:

1. A direct conversion receiver comprising:
   a first amplifier for amplifying a signal input from an antenna;
   a mixer for receiving a predetermined reference signal and separating a carrier signal from the signal output from the first amplifier;
   a local oscillator for supplying the predetermined reference signal to the mixer;
   a low-pass filter (LPF) for excluding a high-frequency component from the signal output from the mixer;
   a second amplifier for amplifying the signal output from the LPF; and
   a shielding ground surface of a substrate structure for preventing self-mixing of signals leaking during which the signal is received by the antenna and processed,
   wherein the mixer and an element constituting the local oscillator are positioned above the shielding ground surface, and an interconnection connecting the mixer and the element constituting the local oscillator are positioned on one side of the shielding ground surface opposite to the side facing the mixer and element constituting the local oscillator.

2. The direct conversion receiver of claim 1, wherein the mixer and an element constituting the local oscillator are bonded with the interconnection by flip-chip bonding, wire bonding or die attach.

3. The direct conversion receiver of claim 1, wherein a via hole is formed to pass through the shielding ground surface and expose one end of the interconnection, and the mixer is connected to the interconnection via a conductive plug filling the via hole.

4. The direct conversion receiver of claim 3, wherein a via hole is formed to pass through the shielding ground surface and expose the other end of the interconnection, and the element of the local oscillator is connected to the interconnection via a conductive plug filling the via hole that exposes the other end of the interconnection.

5. The direct conversion receiver of claim 1, wherein the element of the local oscillator is an active element of the local oscillator that is formed as a bare chip.

6. The direct conversion receiver of claim 1, wherein passive elements of the local oscillator, which is also used as passive elements of the mixer, the first amplifier, the second amplifier and the LPF, are formed below the shielding ground surface.

7. The direct conversion receiver of claim 6, wherein the passive elements are a capacitor, an inductor, and interconnections that connect the capacitor and the inductor.

8. The direct conversion receiver of claim 1, wherein the thickness of the shielding ground surface is several times as thick as the penetration depth of the signal leakage.

9. The direct conversion receiver of claim 1, wherein all of the mixer, the first and second amplifiers, and the LPF are installed in one bare chip.

10. The direct conversion receiver of claim 1, wherein the first amplifier is a low-noise amplifier (LNA) or a drive amplifier (DA).

11. The direct conversion receiver of claim 1, wherein the second amplifier is a drive amplifier.

12. A direct conversion transmitter comprising:
    a first amplifier for amplifying a signal to be transmitted;
    a low-pass filter (LPF) for excluding a high-frequency component from the signal output from the first amplifier;
    a mixer for mixing the signal output from the LPF and a given reference signal;
    a local oscillator for supplying the reference signal to the mixer;
    a second amplifier for amplifying the signal output from the mixer before this signal is transmitted to the outside via an antenna; and
    a shielding ground surface of a substrate structure for preventing self-mixing of signals leaking when the signal is transmitted,
    wherein the mixer and an element of the local oscillator are positioned above the shielding ground surface, and an interconnection, which connects the mixer to the element of the local oscillator, is positioned within the substrate structure below the shielding ground surface.

13. The direct conversion transmitter of claim 12, wherein the mixer and an element constituting the local oscillator are bonded with the interconnection by flip-chip bonding, wire bonding or die attach.

14. The direct conversion transmitter of claim 12, wherein a via hole is formed to pass through the shielding ground surface and expose one end of the interconnection, and the mixer is connected to the interconnection via a conductive plug filling the via hole.

15. The direct conversion transmitter of claim 14, wherein a via hole is formed to pass through the shielding ground surface and expose the other end of the interconnection, and the elements of the local oscillator are connected to the interconnection via a conductive plug filling the via hole that exposes the other end of the interconnection.

16. The direct conversion transmitter of claim 12, wherein the element of the local oscillator is an active element of the local oscillator, which is formed as a bare chip.

17. The direct conversion transmitter of claim 12, wherein passive elements of the local oscillator, which are used as passive elements of the mixer, the first amplifier, the second amplifier, or the LPF, are formed below the shielding ground surface.

18. The direct conversion transmitter of claim 17, wherein the passive elements are a capacitor, an inductor, and interconnections that connect the capacitor and the inductor.

19. The direct conversion transmitter of claim 12, wherein the thickness of the shielding ground surface is several times as thick as the penetration depth of the signal leakage.

20. The direct conversion transmitter of claim 12, wherein the mixer, the first and second amplifiers, and the LPF are installed in a one bare chip.

21. The direct conversion transmitter of claim 12, wherein the first amplifier is a drive amplifier.

22. The direct conversion transmitter of claim 12, wherein the second amplifier is a power amplifier or a drive amplifier.

* * * * *